United States Patent [19]

Carvajal

[11] Patent Number: 4,645,950
[45] Date of Patent: Feb. 24, 1987

[54] TWO-LEAD HALL EFFECT SENSOR

[75] Inventor: Fernando D. Carvajal, McKinney, Tex.

[73] Assignee: Texas Instruments Incorporated, Dallas, Tex.

[21] Appl. No.: 734,014

[22] Filed: May 13, 1985

[51] Int. Cl.[4] .......................................... H03K 17/90
[52] U.S. Cl. .................................... 307/415; 307/309; 330/6
[58] Field of Search ...................... 307/414, 415, 309; 330/6; 318/138, 254, 439; 323/324

[56] References Cited

U.S. PATENT DOCUMENTS

| | | | |
|---|---|---|---|
| 3,215,993 | 11/1965 | Bobeck | 307/415 X |
| 3,613,021 | 10/1971 | Scheidt | 330/6 |
| 3,688,133 | 8/1972 | Flachsbarth | 307/309 |
| 3,867,652 | 2/1975 | Bjorklund et al. | 330/6 X |
| 3,867,656 | 2/1975 | Mitsui et al. | 310/156 X |
| 4,070,606 | 1/1978 | Morozumi et al. | 318/254 A |
| 4,134,030 | 1/1979 | Pace | 307/309 |
| 4,521,727 | 6/1985 | Atherton et al. | 307/309 X |

FOREIGN PATENT DOCUMENTS 1590286  5/1981  United Kingdom ............... 318/254

OTHER PUBLICATIONS

"UGN-3030T/U and UGS-3030T/U Bipolar Hall Effect Digital Switches", Integrated Circuit Engineering Bulletin, Sprague Electric Company, 1980.
"Forked Magnetic Barrier with Hall IC", Component Report X11 (1977), No. 4, pp. 140-142.

Primary Examiner—William M. Shoop, Jr.
Assistant Examiner—Bentsu Ro
Attorney, Agent, or Firm—Richard A. Bachand; N. Rhys Merrett; Melvin Sharp

[57] ABSTRACT

A two-lead Hall effect sensor (10) has a combined voltage supply and output terminal (12) and a ground or reference terminal (14). A Hall device (16), a comparator (18) and a voltage/current converter (20) are each connected between terminals (12) and (14). Hall device (16) supplies a first signal to comparator (18) when it senses a magnetic field strength above a predetermined amount, and supplies a second signal in the absence of the magnetic field strength. Comparator (18) in turn supplies either a first voltage state or a second voltage state to the converter (20). Converter (20) converts the first voltage state into a first current appearing at terminal (12), indicating the sensing of a magnetic field, and similarly converts the second voltage state to a second current, indicating a weak or absent magnetic field.

8 Claims, 3 Drawing Figures

TWO-LEAD HALL EFFECT SENSOR

TECHNICAL FIELD OF THE INVENTION

The present invention pertains in general to magnetic sensors and, more particularly, to Hall effect devices.

BACKGROUND OF THE INVENTION

Hall effect devices are becoming increasingly popular in industry for such purposes as sensing rotors of brushless motors and in other applications where the contactless sensing of moving mechanical elements is desirable. Conventional Hall effect devices have three leads. One lead is provided for the voltage supply, one lead for the ground, and one lead for the output. Thus, for conventional Hall effect devices, three connections have to be provided to the remainder of the system into which they are incorporated. Ideally, however, the number of leads and connections to a sensor should be minimized, especially in situations where space is at a premium both in the finished system and in terms of space required for assembly.

In manufacturing processes, each additional lead on a device generally comes at a cost, generally on the order of dollars per connection. In many applications, leads must be connected to a Hall effect device in a remote location and must be routed to a central location. At the central location, the other ends of the device leads must be connected to sensing and power circuitry. During the assembly of many such devices into a product, the connection costs therefor can be substantial. The connections of the lead ends at the central location often must be made to a small area on a circuit board. Each additional lead required by the device increases the difficulty in making each circuit board connection within the small area, and each additional lead increases the probability that a mistake will be made in connecting the right lead to the right location.

In the design of products such as vehicles, each Hall effect device is specified as taking up a certain volume which cannot be exceeded. This volume in turn determines the amount of contact area that the device can provide for soldering leads to it, the amount of solder that can be used, the size of the lead wires and the amount of wire insulation. For every additional lead required by the device, the specified volume gets more crowded, and contact area per lead, solder amount per lead, lead wire size and lead insulation thickness must all be scaled down. The integrity of the connections of the leads to the device consequently becomes more of a problem.

In view of the above problems, there exists a need for a Hall effect sensor with fewer leads in order to reduce the problems associated with conventional devices which have three or more leads.

SUMMARY OF THE INVENTION

The present invention comprises a two-lead Hall effect sensor. An illustrated embodiment of the Hall effect sensor of the invention includes a first voltage terminal supplying the operating voltage and biasing current to the device and a second voltage terminal connected to ground. A Hall effect device is provided that produces a first voltage signal in response to a magnetic field strength above a predetermined threshold, and a second voltage signal in response to being in the presence of a weak or nonexistent magnetic field. A comparator produces a first voltage state in response to the first voltage signal and a second voltage state in response to the second voltage signal. A converter receives the output of the comparator and sinks current from the first voltage terminal at a first current level indicating that the magnetic field strength is being sensed, or a second current level indicating that the magnetic field strength is not being sensed. These currents may be measured by any conventional current sensing means by differentiating between the first and second currents and the bias current for the device. Since the present invention uses only two leads, one lead serving as both the power and the sensed lead and the other lead serving as the ground, the present invention may be employed advantageously in any situation where it is desirable to minimize the number of leads.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
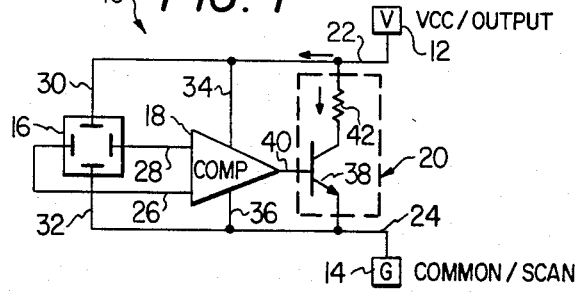
FIG. 1 is a schematic block diagram of the invention showing the major components thereof.

Referring to FIG. 1, a schematic block diagram of the invention is illustrated, showing the major components. A Hall effect sensor 10 has a VCC/output terminal 12 and a common/scan terminal 14. Three components, namely a Hall effect device 16, a comparator 18, and a converter 20 are each connected between terminals 12 and 14. The bias current, or current required to operate device 16 and comparator 18, is supplied via line 22 and a common grounding or voltage reference connection is made via line 24.

Hall effect device 16 is connected to comparator 18 by a first voltage signal line 26 and a second voltage signal line 28. In the quiescent phase of operation of the Hall effect device 16, the voltage on line 26 is higher than the voltage on line 28. Power is supplied to Hall effect device 16 via line 30 and the device 16 is grounded or referenced by line 32. When Hall effect device 16 senses the presence of a magnetic field above a predetermined strength, such as would be produced by the close proximity of a magnet, the voltage on line 28 increases and the voltage on line 26 increases.

Comparator 18 is supplied with operating current by line 34 which is connected to line 22 and is referenced to ground through line 36. The output of comparator 18 is connected to the input of the converter 20 by a line 40. Converter 20 is connected between the VCC/output terminal 12 through line 22 and to the ground terminal 14 through line 24. Converter 20 is operable to sink a predetermined amount of current from the VCC/output terminal 12 to the ground terminal 14. The predetermined current varies between a fist current level when the output of the comparator 18 is at a logic "high" level and zero current when the output of the comparator 18 is at a logic "low" level.

The converter 20 is comprised of an NPN transistor 38 having the base thereof connected to the output of comparator 18, the emitter thereof connected to the ground terminal 14 through line 24 and the collector thereof connected to one end of a resistor 42. The other end of resistor 42 is connected to the VCC/output terminal 12 through line 22. When resistor 42 is connected to ground through transistor 38, the value thereof determines the first current level.

In operation, comparator 18 turns on transistor 38 and sinks the first current level through converter 20 when a high voltage on line 28 of the Hall effect device 16 is compared to the voltage on line 26 thereof. If the voltage on line 26 is greater than the voltage on line 28, comparator 18 turns transistor 38 off and zero current is sinked by converter 20.

When transistor 38 is turned on, the first current level is sinked from the VCC/output terminal 12, and a current equal to the first current level plus the bias current is sinked from the VCC/output terminal 12. When transistor 38 is turned off, the current sinked from the VCC/output terminal 12 is equal to the bias current required to operate both the Hall effect device 16 and comparator 18. In this manner, the VCC/output terminal 12 functions both as the voltage supply and as the output, obviating the need for a third terminal. Converter 20 may take other forms, such as a current mirror or another sort of current source operating in response to the voltage state appearing on the output of comparator 18.

Figure 2:
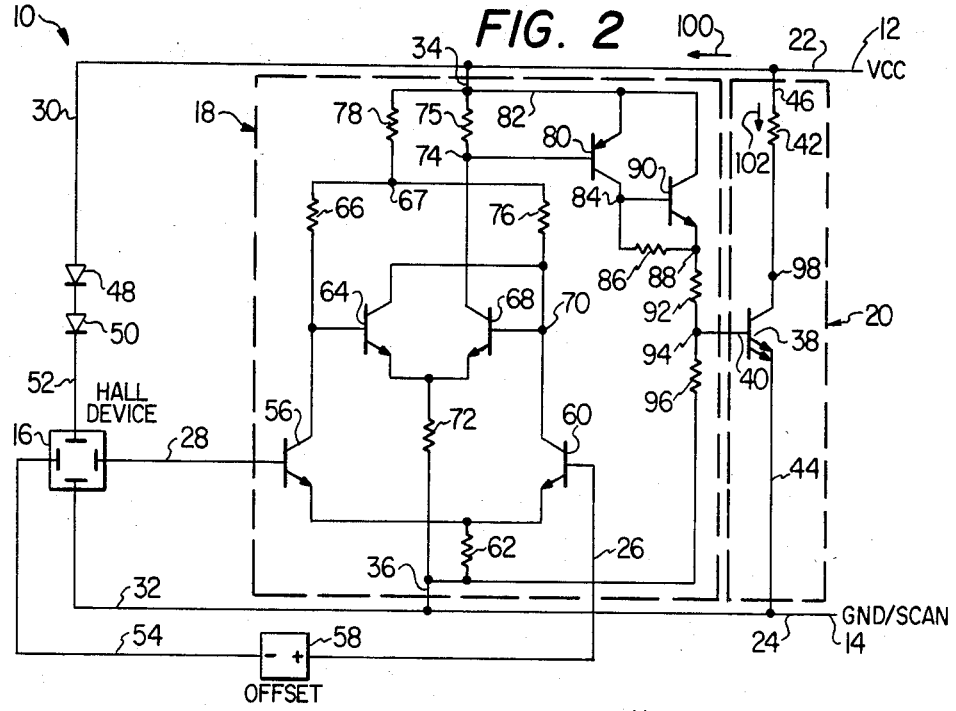
FIG. 2 is a schematic diagram of an embodiment of the invention whereby a differential Hall effect element and a differential hysteresis comparator are utilized.

Referring now to FIG. 2, there is illustrated one embodiment of the invention in more detail wherein like numerals refer to like parts in the various figures. The illustrated Hall effect device 16, comparator 18 and NPN transistor 38 are incorporated into a single sensor of a type including the TL172 Normally Off Hall-Effect Switch manufactured by Texas Instruments Incorporated. Simpler, custom designed integrated circuits could be fabricated in practicing the invention. In the illustrated embodiment, the VCC/output terminal 12 supplies five volts DC to bias line 22 and therefore the Hall effect device supplies line 30. Two diodes 48 and 50 are connected in series between supply line 30 and Hall effect device supply terminal 52. Hall effect device 16 is basically a tank of N-type silicon with four contacts as shown. Signal line 28 is connected to the base of a transistor 56 and a signal line 54 is connected to one side of a voltage offset 58. The other side of voltage offset 58 is connected by line 26 to the base of a transistor 60. Transistors 56 and 60 are configured as a matched differential pair. The emitters of transistors 56 and 60 are connected to ground by a common resistor 62.

The collector of transistor 56 is connected to the base of an NPN transistor 64 and one side of a resistor 66, the other side of which is connected to a node 67. The collector of transistor 60 is connected to the base of a transistor 68 and a node 70. The emitters of transistors 64 and 68, which are configured as a matched differential pair, are connected to ground through a common resistor 72. The collector of transistor 64 is connected to node 70 and the collector of transistor 68 is connected to node 74.

A resistor 76 is connected between node 70 and node 67. A resistor 78 is connected between node 67 and a comparator bias line 82. Bias line 82 connects to comparator bias line 34, which in turn connects to sensor bias line 22. Node 74 is connected to the base of a PNP transistor 80. The emitter of transistor 80 is connected to bias line 82 and the collector thereof is connected to a node 84. Node 84 is connected through a resistor 86 to a node 88, and is also connected to the base of an NPN transistor 90. The collector of transistor 90 is connected to line 82 and the emitter thereof is connected to node 88. A resistor 92 is connected between node 88 and a node 94. A resistor 96 is connected between node 94 and comparator ground line 36. Node 94 is also connected to the base of transistor 38 in converter 20 by line 40.

In operation, a 1.2 volt drop across diodes 48 and 50 results in 3.8 volts across Hall effect device 16. In a quiescent state, device 16 will supply a 1.9 volt signal on line 28 and a 1.9 volt signal on line 54. Offset element 58, which can be constructed by purposefully misaligning contacts on an IC chip, adds 0.1–0.13 volt to the signal on line 54. Therefore, a signal of about 2.0 volts will appear at the base of transistor 60 in the absence of a magnetic field above a predetermined strength at Hall effect device 16. In its quiescent state, a voltage of approximately 1.9 volts appears on line 28 and the base of transistor 56. The difference in base voltages of transistors 60 and 56 under this operating condition will cause the voltage of common sink resistor 62 to be raised until the base-emitter voltage of transistor 56 is less than 0.7 volt, turning off transistor 56. Resistor 62 has a value of about 3.1K ohms. Transistor 60 under these conditions conducts current, resulting in a voltage drop across resistor 76, reducing the voltage present at the base of transistor 68. Resistor 76 is selected such that the voltage drop across it and resistor 78 is sufficient to lower the $V_{BE}$ of transistor 68 below 0.7 volt. This condition will occur when resistor 78 is selected to be 690 ohms and resistor 76 is selected to be 1,000 ohms.

When transistor 68 is not conducting, the voltage drop across resistor 75 (8K ohms) is small and transistor 80 is turned off. Transistor 80 will thus be unable to supply a turn-on voltage to transistor 90 across resistor 86 (22K ohms), which will in turn be unable to supply a turn-on voltage on line 40 across resistor 96 (4K ohms). Since NPN transistor 38 will therefore be off, no current is drawn through resistor 42 (about 1000 ohms), and the current measured at VCC will be equal to a bias or operating current 100 only (about 6 mA).

When Hall effect device 16 senses a magnetic flux density sufficient to exceed the voltage of offset voltage 58, the voltage on line 28 will exceed the voltage on line 26, turning on transistor 56 and turning off transistor 60. The operation of transistor 56 will, therefore, cause current to be drawn through resistors 66 (1920 ohms) and 78, reducing the voltage at the base of transistor 64 to the point that it will no longer operate. Transistor 64 provides a hysteresis effect, wherein a magnetic field strength level more positive than a first predetermined value causes transistor 68 to conduct and transistor 64 to turn off, while a level less than a second magnetic field strength causes the reverse to be true. Transistors 64 and 68 therefore flip-flop in their operation between two stable states. Sink transistor 72 is selected to be 19.4K ohms.

The operation of transistor 68 causes current to be drawn through resistor 75, biasing the base of transistor 80 sufficiently to turn it on. Transistor 80 draws current through resistor 86, producing a voltage drop sufficient to turn on transistor 90. Transistor 90 sources current to resistors 92 and 96, and the voltage drop across resistor 96 will exceed 0.7 volt so as to turn transistor 38 on. In this embodiment, resistors 86 and 92 are selected to be 22K ohms and 5K ohms, respectively. Finally, the operation of transistor 38 will cause a relatively large switching current 102 (about 14 mA) to be drawn through resistor 42. The current drawn through terminal 12 will be equal to the sum of currents 100 and 102 (about 20 mA) and will indicate to any current sensing device on terminal 12 that Hall effect device 16 has sensed a magnetic field above a certain threshold strength.

In the 3-lead Hall effect sensor, the impedance of transistor 38 would be measured at a node 98. This impedance would, of course, be large if transistor 38 was not turned on, and would be small if transistor 38 was turned on. The placement of resistor 42 from node 98 to voltage supply terminal 12 removes the necessity of having a third output lead.

Figure 3:
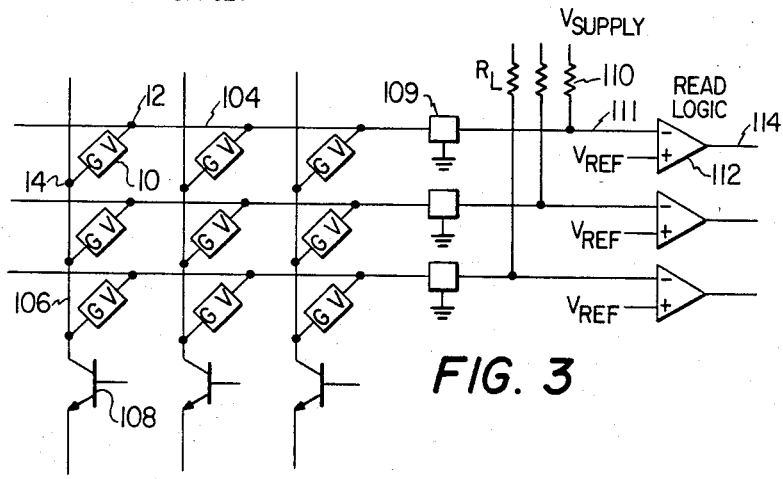
FIG. 3 is a schematic diagram of a switching array employing the invention, such as would be used in a keyboard.

FIG. 3 illustrates only one of a large number of applications for the 2-lead Hall effect sensor of the invention. In the illustrated application, a plurality of Hall effect sensors 10 are placed beneath keyboard buttons having magnets attached thereto (not shown). The voltage supply terminal 12 of each Hall effect device is connected to a read line 104. The ground connection 14 of each Hall effect sensor is connected to a scan line 106. Each scan line 106 is driven by a scanning transistor 108. Scanning logic (not shown) will operate to successively turn on scanning transistor 108 in order to enable operation of each column of Hall sensors 10. Each read line 104 is attached to a series regulator 109. Each series regulator 109 produces a high voltage on its output line 111 in response to a large current on read line 104, a low voltage on line 111 in response to a large current on read line 104, and a low voltage on line 111 in response to a low current on line 104. Each line 111 is connected to a voltage supply through a pull up resistor 110 and terminates in a read logic element 112. The logic element 112 is set such that a voltage $V_{IH}$ above a certain voltage reference ($V_{REF}$) will cause the generation of a first polarity bit on a line 114 and a sensed voltage $V_{IL}$ below $V_{REF}$ will cause the generation of a second polarity bit on line 114. It will be noted that only two leads are necessary to connect each Hall element 10 to effectively function in the switching array. Because of this, no third output lead need be provided, since both the operating voltage and the output current appear on read line 104.

In summary, the present invention provides a magnetic field sensor with only two leads: a first lead which doubles as both the bias line and the output line, and a second ground or reference lead. The current drawn from the bias supply is varied to indicate a change in magnetic flux density. The provision of a Hall effect sensor with only two leads reduces the problems associated with three-lead devices in terms of expense, labor, complexity and quality assurance.

Although one embodiment of the invention has been described in detail, it should be understood that various changes, substitutions and alterations can be made. In particular, the differential Hall element and differential comparator shown can be replaced by a linear Hall element and a differential amplifier without a hysteresis component. Other variations, substitutions and alterations can be made to the detailed description without departing from the spirit and scope of the invention, which is defined by the appended claims.

What is claimed is:

1. A magnetic field sensor having first and second terminals, comprising:
    a Hall effect device for producing a voltage in response to a magnetic field;
    a comparator connected to receive the voltage produced by said Hall effect device for producing a first voltage in response to the presence of a magnetic field above a predetermined threshold strength and a second voltage in the absence of said magnetic field strength;
    a current sink connected between said first and second terminals controlled by said comparator for sinking a current from said first terminal in response to said first voltage and not in response to said second voltage;
    a current supply connected to the first terminal for supplying operating current at least to said Hall effect device and
    a return line connected to the second terminal from said Hall effect device;
    whereby the presence of a magnetic field above said predetermined threshold causes an increased current to be drawn through said first terminal, the increased current being substantially equal to the current which is sinked by said current sink.

2. The magnetic field sensor of claim 1, wherein said current supply provides biasing current to said comparator.

3. The magnetic field sensor of claim 1, wherein said current sink includes a resistance connected to said current supply.

4. The magnetic field sensor of claim 1, wherein said current sink includes a current switch on a switching current line connected to said current supply, said current switch being coupled with said comparator, said current switch inducing the flow of said sinking current in said switching current line in response to said first voltage.

5. A method of sensing a magnetic field with a two-terminal device, said device having a combined supply and sensing terminal and a voltage reference terminal comprising:
    producing a first voltage in response to a magnetic field above a predetermined level;
    producing a second voltage in response to the absence of the magnetic field above the predetermined level;
    converting the first voltage to a first current drawn through the supply and sensing terminal; and
    converting the second voltage to a second current drawn through the supply and sensing terminal;
    wherein the steps of producing the first and second voltages further include the steps of:
    raising the voltage on a first voltage line above the voltage to a second voltage line in response to the presence of the magnetic field;
    raising the voltage on the second voltage line above the voltage on the first voltage line in response to the absence of the magnetic field;
    comparing the voltage on the first voltage line to the second voltage line;
    generating the first voltage in response to the first voltage line being at a higher potential than the second voltage line;
    and generating the second voltage in response to the second voltage line being at a higher potential than the first voltage line.

6. The method of claim 5, wherein the step of converting the first voltage to the first current includes a step of inducing a switching current to flow through a resistor connected to the supply and sensing terminal in response to the first voltage, the switching current plus a device bias current being drawn through said supply and sensing terminal as said first current.

7. The method of claim 6, wherein the step of converting the second voltage to the second current includes preventing the switching current from flowing, thereby drawing the device bias current, through said second terminal as said second current.

8. The method of claim 7, wherein the step of inducing a switching current includes impressing the first voltage onto a base of a bipolar transistor, the switching current flowing into a collector of the transistor in response to said first voltage.

* * * * *